United States Patent [19]

Sakamoto

[11] Patent Number: 5,248,893
[45] Date of Patent: Sep. 28, 1993

[54] INSULATED GATE FIELD EFFECT DEVICE WITH A SMOOTHLY CURVED DEPLETION BOUNDARY IN THE VICINITY OF THE CHANNEL-FREE ZONE

[75] Inventor: Shinichi Sakamoto, Atsugi, Japan

[73] Assignee: Advanced Micro Devices, Inc., Sunnyvale, Calif.

[21] Appl. No.: 593

[22] Filed: Jan. 5, 1993

Related U.S. Application Data

[63] Continuation of Ser. No. 660,522, Feb. 25, 1991, abandoned.

[30] Foreign Application Priority Data

Feb. 26, 1990 [JP] Japan .................... 2-47100

[51] Int. Cl.⁵ .................. H01L 29/76; H01L 29/94
[52] U.S. Cl. ....................... 257/409; 257/288
[58] Field of Search ........... 357/23.1, 23.11, 55; 257/288, 409

[56] References Cited

U.S. PATENT DOCUMENTS

| | | | |
|---|---|---|---|
| 3,675,313 | 7/1972 | Driver et al. | 357/23.1 |
| 4,536,782 | 8/1985 | Brown | 357/23.1 |
| 4,835,584 | 5/1989 | Lancaster | 357/23.1 |
| 4,965,219 | 10/1990 | Cerofolini | 357/23.1 |

FOREIGN PATENT DOCUMENTS

| | | | |
|---|---|---|---|
| 0354449 | 2/1990 | European Pat. Off. | 357/23.1 |
| 52-15274 | 2/1977 | Japan | 357/23.1 |
| 53-032681 | 3/1978 | Japan | 357/23.1 |
| 54-23478 | 2/1979 | Japan | 357/23.1 |
| 54-146584 | 11/1979 | Japan | 357/23.1 |
| 58-202560 | 11/1983 | Japan | 357/23.1 |
| 60-214570 | 10/1985 | Japan | 357/23.1 |
| 61-292373 | 12/1986 | Japan | 357/23.1 |
| 63-73665 | 4/1988 | Japan | 357/23.1 |
| 63-153861 | 6/1988 | Japan | 357/23.1 |
| 63-300565 | 12/1988 | Japan | 357/23.1 |
| 1-067966 | 3/1989 | Japan | 357/23.1 |

OTHER PUBLICATIONS

IEEE Transactions on Electron Devices, vol. ED-30, No. 6, Jun. 1983, pp. 681-686, Fiji Takeda et al.: "New Grooved-Gate MOSFET with Drain Separated from Channel Implanted Region".

Primary Examiner—Rolf Hille
Assistant Examiner—Steven Loke
Attorney, Agent, or Firm—Fliesler, Dubb, Meyer & Lovejoy

[57] ABSTRACT

An apparatus and method for forming an insulated gate field effect device including a first conductivity-type semiconductor substrate having a concave with a curved surface formed on the main surface, an insulating film formed on the major surface including the concave, a first and second impurity regions of a second conductivity-type formed in the vicinity of the main surface at one side and the other side of the concave, respectively, and a conductive layer formed on the channel region which is formed along the concave between the first and second impurity regions with the insulating film interposed therebetween. The method includes forming a concave with the curve surface on the main surface of a semiconductor substrate; forming an insulating film on the main surface, forming a conductive layer above the concave with an insulating film interposed therebetween; forming a first and second impurity regions of a second conductivity type in the vicinity of the main surface at one side and the other side of the concave.

14 Claims, 5 Drawing Sheets

FIG. 1
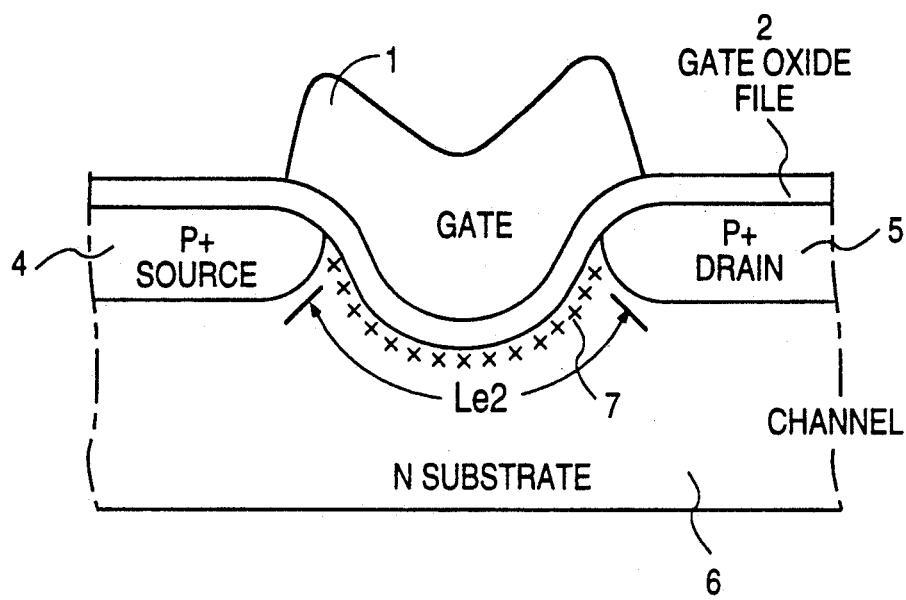
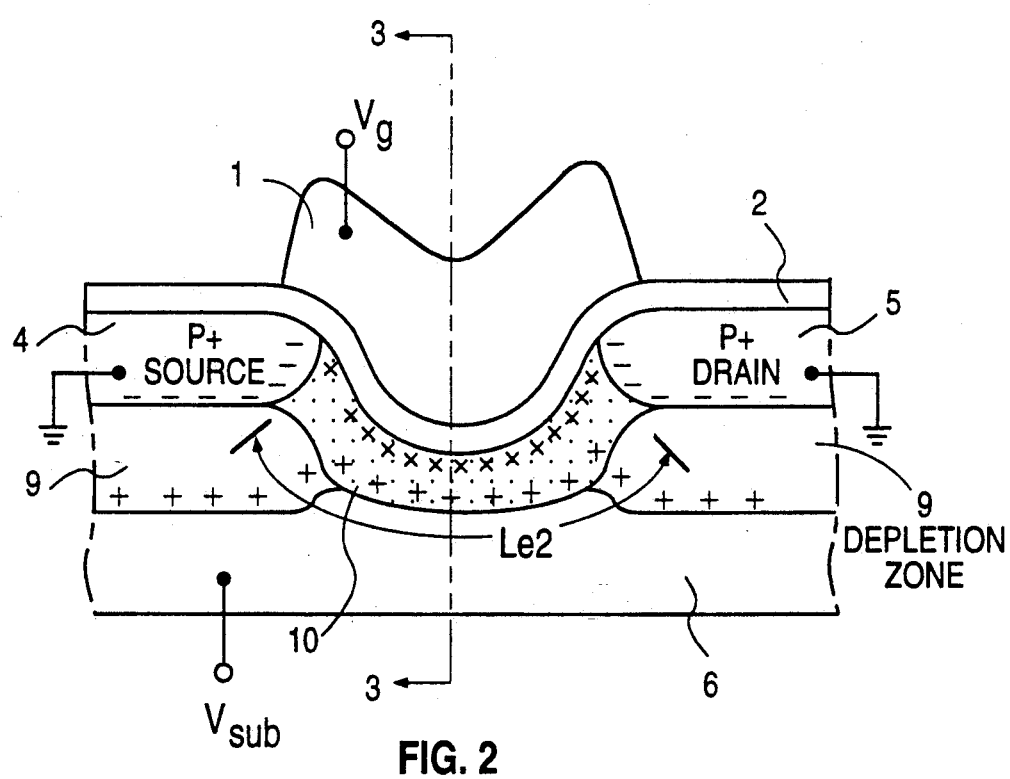
FIG. 2

INSULATED GATE FIELD EFFECT DEVICE WITH A SMOOTHLY CURVED DEPLETION BOUNDARY IN THE VICINITY OF THE CHANNEL-FREE ZONE

This application is a continuation of Ser. No. 07/660,522 filed Feb. 25, 1991, now abandoned.

CROSS-REFERENCE TO RELATED APPLICATION

This application claims priority to Japanese Patent Application Serial No. 02-47100, filed Feb. 26, 1990, inventor Shinichi Sakamoto.

BACKGROUND OF THE INVENTION

1. Field of the Invention

The invention relates generally to insulated gate field effect devices, and more particularly, to achievement of a longer effective channel length without increasing the occupying area for insulated gate field effect devices and a method of forming the same.

2. Description of the Related Art

As the high integration of semiconductor integrated circuit devices (IC) make progress, various problems arise. In insulated gate field effect devices, the following problems caused by the high integration are noted.

FIG. 6 is a sectional view showing a structure of a conventional planar insulated gate field effect device. A MOS transistor is indicated in this figure. Referring to FIG. 6, the MOS transistor comprises a n type semiconductor substrate e.g. a n type silicon substrate 6, a p+ source 4 and a p+ drain 5 each formed in the vicinity of the main surface of semiconductor substrate 6 by diffusion, a gate oxide film 22 formed on the main surface of substrate 6, and a conductive layer formed above the main surface of substrate 6 with an insulating film 22 interposed therebetween, i.e., a gate 21. A channel region 27 which is indicated by "x" in the figure is formed in the vicinity of the main surface between the source 4 and the drain 5. Since the length of the channel region will be slightly corroded by a diffusion for the formation of the source 4 and the drain 5, an effective channel length Le1 is obtained in practice.

FIG. 7 is a structural sectional view showing the development of a depletion layer in the MOS transistor of FIG. 6. Referring to FIG. 7, the source 4 and the drain 5 are grounded to make definite the development of a depletion layer. Accordingly, a depletion layer 29 is formed so as to surround the source 4 and the drain 5.

In addition, voltage $V_G$ is supplied to the gate 1 causing a depletion layer 20 with a trapezoid configuration to be formed under the gate 1 and between the depletion layers 29. In this case, the effective channel length Le1 is defined by the longer side of the trapezoid depletion layer 20. Substrate voltage $V_{sub}$ is supplied to the substrate 6.

FIG. 8 is a structural sectional diagram of the structure in FIG. 7 when seen from the arrow 8. Referring to FIG. 8, a depletion layer 20 having an effective channel width of We1 is formed between local oxidation of silicons (referred to as LOCOS hereinafter) 11 for element isolation.

PROBLEMS TO BE SOLVED BY THE INVENTION

FIG. 9 is a structural sectional view showing the status when operating voltage is supplied to the MOS transistor of FIG. 6. Referring to FIG. 9, voltage $V_D$ is supplied to the drain 5, and voltage $V_G$ is supplied to the gate 1. The source 4 is grounded. It is seen from FIG. 9 that the length of channel region 13 retracts from the drain 5 when the operating voltages $V_D$ and $V_G$ are supplied. In other words, between one end of the channel region 13 and the drain 5, there is a region of a length Lg1 without a channel being formed therein. This means that field concentration will occur in the vicinity of the main surface of the depletion layer 20 near the drain 5.

This field concentration will cause the following several problems. First, breakdown voltage will occur in the vicinity of the drain due to its field concentration resulting in current to flow into the substrate 6. This means that a greater voltage cannot be supplied to the gate 1 and the drain 5. In addition, electrons (hot electrons) accelerated by field concentration will flow into the gate oxide film 22 to cause degradation in withstand voltage of the gate oxide film 22. Summarizing the above description, it is pointed out that the voltage that can be supplied to the drain 5 (the drain withstand voltage) and the voltage that can be supplied to the gate 21 (the gate withstand voltage) are degraded.

Furthermore, since the depletion layer 20 has a trapezoid configuration as shown in FIG. 9 (this phenomenon is called "fringe effect"), it is also noted that the current is not increased in proportion to the length of the gate. Ideally, the current flowing between the drain and the source increases in proportion to the length of the gate in an insulated gate field effect device. However, the above-mentioned fringe effect will hinder the proportional increase of the current. That is to say, as the channel length shortens, threshold voltage Vt decreases. Therefore, subthreshold current will flow to the source 4 from drain 5 when the transistor should be turned off.

The invention was made to solve the above problems, and has an object to obtain a longer effective channel length without increasing the occupying area in an insulated gate field effect device.

SUMMARY OF THE INVENTION

An insulated gate field effect device in accordance with the present invention comprises a first conductivity type semiconductor substrate having a concave with a curved surface formed on the main surface, an insulating film formed on the major surface including the concave, first and second impurity regions of a second conductivity type formed in the vicinity of the main surface and at one side and the other side of the concave respectively, and a conductive layer formed on the channel region which is formed along the concave between the first and second impurity regions with the insulating film interposed therebetween.

A method of forming an insulated gate field effect device in accordance with the present invention comprises the steps of forming a concave with a curved surface on the main surface of a semiconductor substrate, forming an insulating film on the main surface including the concave, forming a conductive layer above the concave with an insulating film interposed therebetween, forming first and second impurity regions of a second conductivity type in the vicinity of the main surface and at one side and the other side of the concave. Function An insulated gate field effect device in accordance with the present invention has a channel region formed along a concave to obtain a longer effective channel length without an increase in the occupying area.

BRIEF DESCRIPTION OF THE DRAWINGS

FIG. 1 is a sectional view of the structure of a MOS transistor showing an embodiment of the invention.

FIG. 2 is a structural sectional view showing the development of a depletion layer in the MOS transistor of FIG. 1.

In the figures, 1 is the gate, 2 is the gate oxide film, 4 is the source, 5 is the drain, 6 is the semiconductor substrate, 7 is the channel region, 9 and 10 are the depletion layer, Le1 and Le2 are the effective channel lengths.

DESCRIPTION OF THE PREFERRED EMBODIMENT

Figure 6:
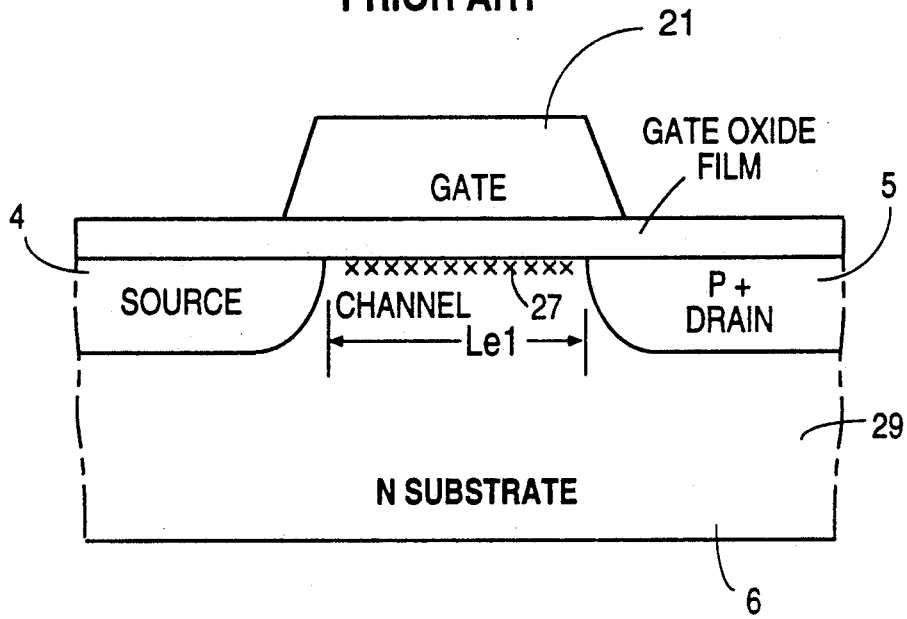
FIG. 6 is a sectional view showing the structure of a conventional MOS transistor.

FIG. 1 is a sectional view of a structure of an insulated gate field effect device showing an embodiment of the invention. In this figure, a MOS transistor is indicated by way of an example. Referring to FIG. 1, the MOS transistor comprises a semiconductor substrate having a concave which is formed as a smooth curve, i.e., a silicon substrate 6, a source 4 and a drain 5 formed on one side and the other side of the concave by diffusion respectively, a gate oxide film 2 formed on the main surface of the substrate 6 including the concave, and a conductive layer formed on the concave, i.e., a gate 1. A channel region 7 is formed along the concave between the source 4 and the drain 5 to obtain an effective channel length Le2 that is longer than the effective channel length Le1 shown in FIG. 6.

FIG. 2 is a structural sectional view showing the development of a depletion layer in the MOS transistor of FIG. 1. Referring to FIG. 2, a source 4 and a drain 5 is provided to facilitate the development of the depletion layer. A depletion layer 9 is formed below the source 4 and the drain 5. Also, a depletion layer 10 is formed along the concave between the source 4 and the drain 5. When gate voltage $V_G$ is supplied, a channel region is formed in the depletion layer 10 along the concave.

Figure 3:
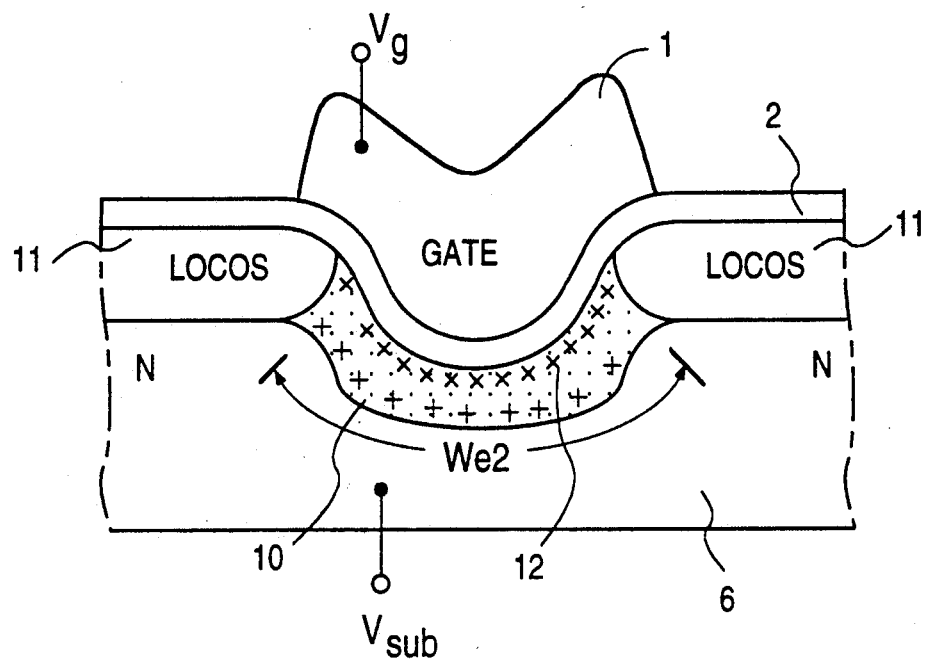
FIG. 3 is a sectional structure view of the structure in FIG. 2 when seen from a different direction.

FIG. 3 is a structural sectional view of the structure in FIG. 2 when seen from the direction of the arrow 3. Referring to FIG. 3, a depletion layer 10 is formed between LOCOS 11 along the concave when gate voltage $V_G$ is supplied. A channel region 12 having the effective channel width We2 is formed along the concave in the depletion layer 10.

Figure 4:
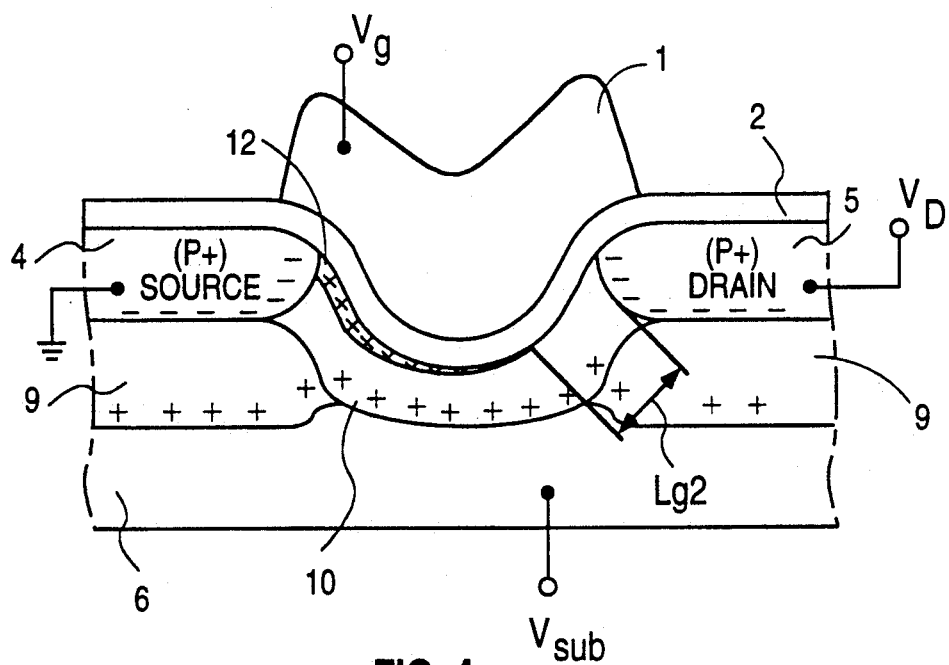
FIG. 4 is a structural sectional view of the state when operating voltages are supplied to the MOS transistor of FIG. 1.

FIG. 4 is a structural sectional view showing the status when operating voltages are supplied to the MOS transistor of FIG. 1. The MOS transistor of FIG. 4 has the same operating voltages shown in FIG. 9, that is, has gate voltage $V_G$ and drain voltage $V_D$ supplied. By comparing FIG. 4 to FIG. 9, it can be seen that the two MOS transistors have the same occupying area, except that the distance Lg2 between the end of channel region 12 and the drain 5 is longer than the distance Lg1 indicated in FIG. 9. That is to say, since the effective channel length Le2 shown in FIG. 1 is longer than the effective channel length Le1 shown in FIG. 6, the field concentration in the vicinity of the drain is reduced as compared with that of the MOS transistor in FIG. 6.

With the decrease of field concentration in the vicinity of the drain, electrons (hot electrons) accelerated by field concentration is prevented from flowing to the substrate 6 or the gate oxide film 2. Since the current flow to substrate 6 caused by voltage breakdown can be prevented, the degradation of the voltage to be supplied to the drain (the drain withstand voltage) may be avoided. In addition, the degradation of the voltage to be supplied to the gate oxide film 2 (the gate withstand voltage) may also be avoided.

Figure 7:
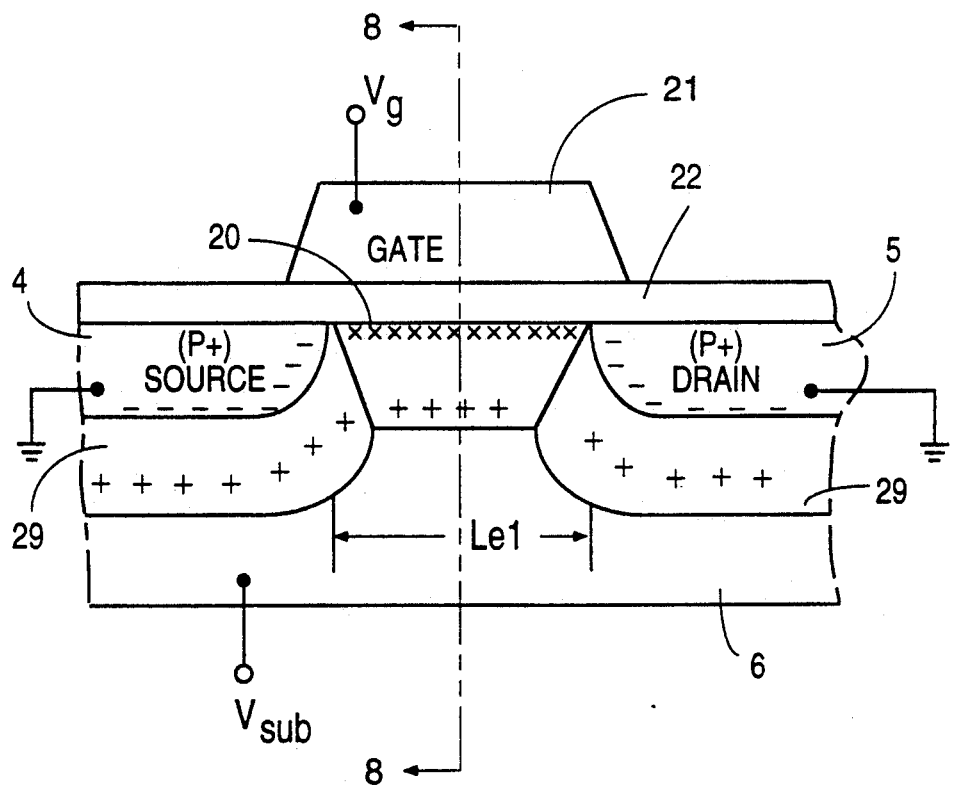
FIG. 7 is a structural sectional view showing the development of a depletion layer in the MOS transistor of FIG. 6.
Figure 8:
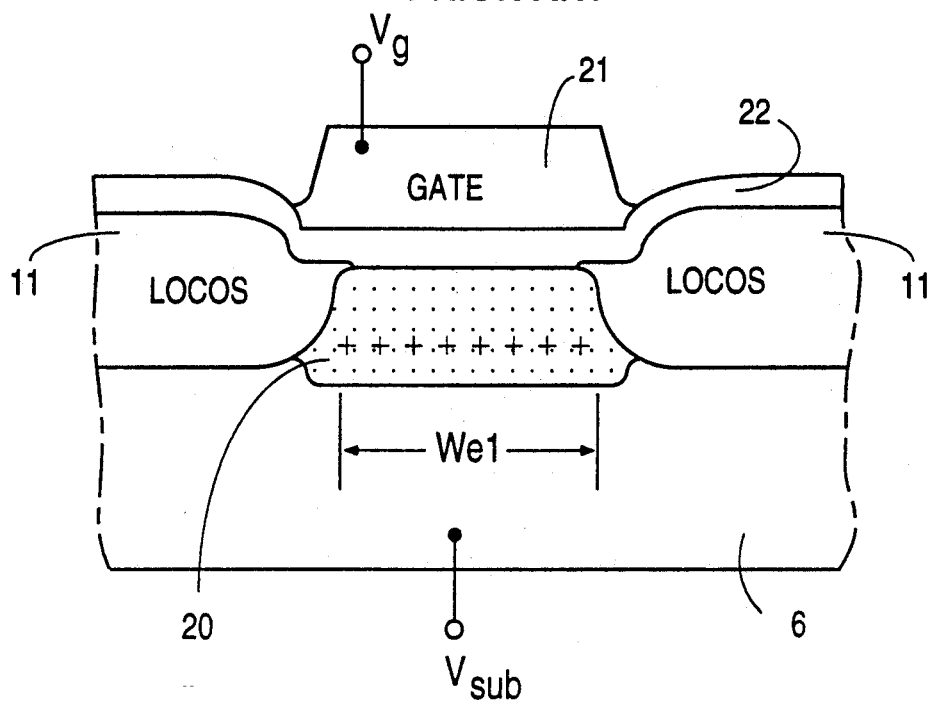
FIG. 8 is a structural sectional view of the structure in FIG. 7 when seen from a different direction.
Figure 9:
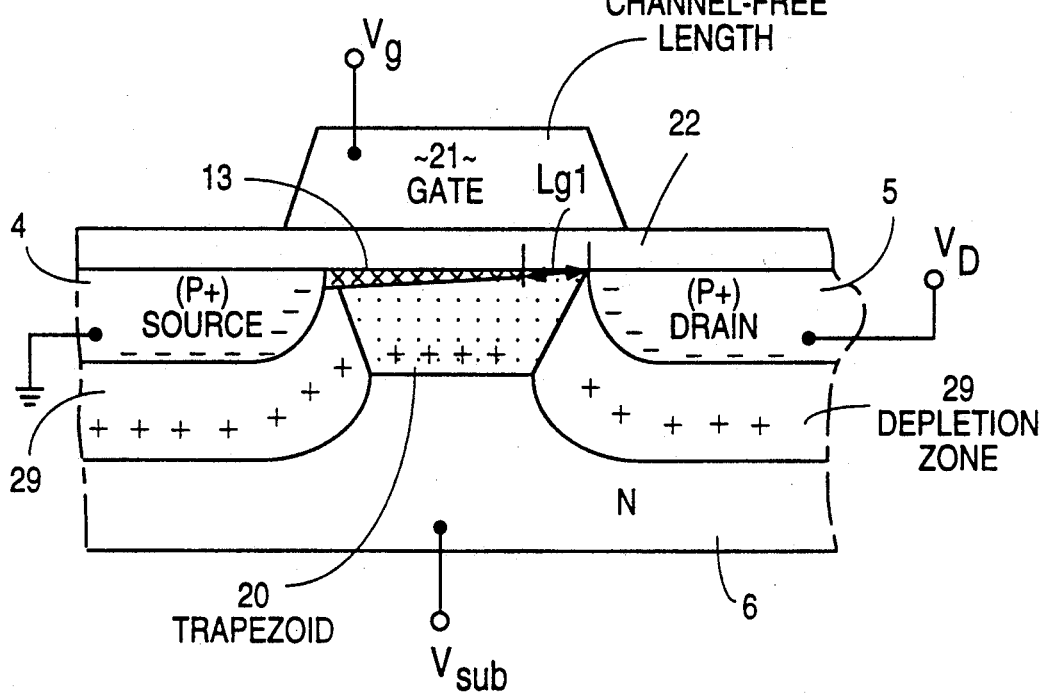
FIG. 9 is a structural sectional view showing the state when operating voltages are supplied to the MOS transistor of FIG. 6.

Furthermore, a strip depletion layer 10 is formed along the concave as shown in FIGS. 2 and 4, resulting in a current flow which is proportional to the gate length. In conventional MOS transistors, a depletion layer 10 having a trapezoid configuration as shown in FIGS. 7 and 9 due to fringe effect is formed. On the contrary, a strip depletion layer 10 as shown in FIGS. 2 and 4 according to the present invention is obtained. Consequently, the effect of a short or a long effective channel length is reduced.

In addition, the variation of threshold voltage Vt caused by the variation of the supplied gate voltage can be prevented. As a result, the generation of the sub threshold current may also be avoided.

Figure 5A:
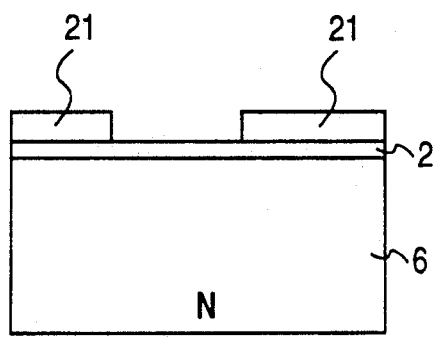
FIGS. 5A-5E are processing diagrams showing the formation of the MOS transistor of FIG. 1.
Figure 5D:
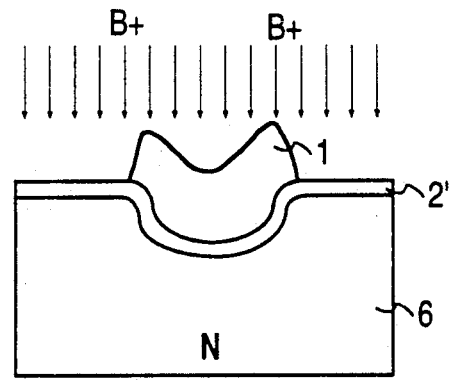
Figure 5B:
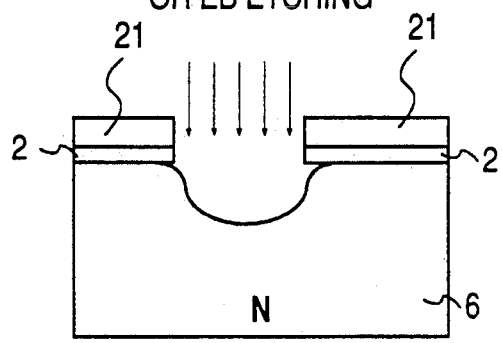
Figure 5E:
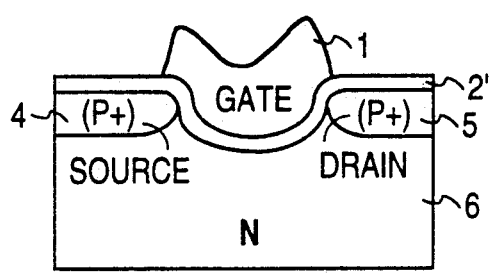
Figure 5C:
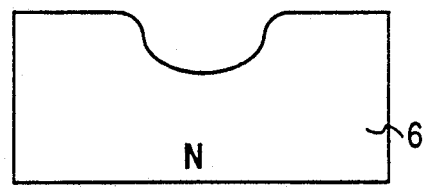

FIGS. 5A-5E are diagrams showing the process of forming the MOS transistor of FIG. 1. Firstly, as shown in FIG. 5A, an oxide film 2 is formed on a silicon substrate 6, followed by the formation of a patterned resist 21 on the oxide film 2. Then, as shown in FIG. 5B, an isotropic etching such as plasma etching or focal ion beam (hereinafter referred to as EB) from above is performed to form a concave on the substrate 6. By removing the resist 21 and the oxide film 2, a silicon substrate 6 having a concave formed as shown in FIG. 5C is obtained.

Next, as shown in FIG. 5D, an new oxide film 2' is formed on the substrate 6 including the concave portion, and a conductive layer 1 for constituting a gate, is formed at the concave portion of the new oxide film 2'. By implanting boron ions B+ from above into the substrate 6 to be diffused with thermal process, the MOS transistor shown in FIG. 5E, i.e. an insulated gate field effect device having the structure shown in FIG. 1 is obtained.

In the MOS transistor shown in FIG. 1, the depth of the concave formed in the vicinity of the main surface of the substrate 6 is preferably set to the same value of the depth of the source 4 and the drain 5. The effect of the embodiment of this invention is most significant when the depth of the concave is set to a value which ranges between the depth of the source 4 and the drain 5 and its twofold. That is to say, when the depth of the drain is 0.5-0.6 $\mu$m, the depth of the concave is set to a maximum of approximately 1.0 $\mu$m. The effective channel length will be designed to lie within the range of 0.5 to 1.0 μm, resulting in the achievement of a 0.7 to 1.4 μm effective channel length in practice.

The configuration of the concave should preferably be smooth towards the direction of the drain 5 from the source 4. In other words, it is preferable to form a concave which is comprised of a curved surface. This is because if a concave which does not have a smooth configuration is formed, field concentration will occur at that portion.

EFFECT OF THE INVENTION

In accordance with the present invention, a channel region is formed along a concave between first and second impurity regions to obtain an insulated gate field effect device having a longer effective channel length without increasing the occupying area.

What is claimed is:

1. An insulated gate field effect device comprising:
   a first conductivity type semiconductor substrate having a main surface;
   said semiconductor substrate having a concave surface formed on said main surface extending to a prespecified depth below the main surface;
   an insulating film formed on said concave surface;
   a conductive gate electrode formed above said insulating film, overlying the concave surface;
   first and second impurity regions of a second conductivity type respectively formed in the substrate, in the vicinity of said main surfaces, self-aligned to and positioned at one side and the other side of said gate electrode respectively; and
   a first conductivity type region located in said semiconductor substrate between said first and second impurity regions for defining a channel region and a channel-free region extending conformably under and along said concave surface;
   wherein the depth of said concave surface is set to a value which ranges between one and two times the depth of said first and second impurity regions, and
   wherein the concave surface is continuously curved in the vicinity of at least one of the first and second impurity regions to produce smooth merger of a conforming first depletion region formed around the at least one impurity region and a conforming second depletion region formed in the vicinity of the gate electrode so that excessive field concentration will not develop in the vicinity where the first and second depletion regions meet.

2. An insulated gate field effect device according to claim 1, wherein one of said first and second impurity regions constitutes a drain region of said insulated gate field effect device, the other of said first and second impurity regions constitutes a source region and wherein the concave surface is continuously curved at least in the vicinity of the drain region, where the channel-free region develops during an off state of the device, to produce smooth merger of the conforming first depletion region which develops in the vicinity of the channel-free region and the drain region and the conforming second depletion region formed in the vicinity of the gate electrode so that excessive field concentration will not develop in the vicinity of the channel-free region.

3. An insulated gate field effect device according to claim 1, which comprises a metal oxide semiconductor (MOS) transistor, and wherein said insulating film comprises an oxide film.

4. An insulated-gate field effect transistor comprising:
   a substrate having a substantially planar main surface and a concave surface portion extending continuously from the main surface to a predetermined depth below the main surface;
   an insulating layer conformably disposed on the main surface and the concave surface portion;
   a gate conformably disposed on the insulating layer, overlying the concave surface portion, the gate having opposed first and second sides;
   implanted source and drain regions disposed within the substrate and self-aligned to the respective first and second opposed sides of the gate; and
   a channel-region formed between the source and drain regions, for defining a channel that conducts current between the source and drain regions when the transistor is in a turned-on state;
   wherein a channel-free zone develops in the substrate, under the gate and between the source and drain regions, when the transistor is in a turned-off state; and
   wherein the gate and concave surface portion are curved at least in the vicinity of the channel-free zone such that a smoothly curved depletion zone boundary will develop in the vicinity of the channel-free zone when the transistor is in the turned-off state.

5. An insulated-gate field effect transistor according to claim 4 wherein the concave surface portion is curved in a transverse cross-sectional plane extending through the transistor between but not intersecting the first and second sides of the gate so as to provide an effective channel width greater than a width of the channel as projected onto the plane of the main substrate surface.

6. An insulated-gate field effect transistor according to claim 5 wherein the concave surface portion is curved both in the transverse cross-sectional plane and in a non-transverse cross-sectional plane, extending between and joining the first and second sides of the gate, so as to provide an effective channel surface area greater than an area of the channel as projected onto the plane of the main substrate surface.

7. An insulated-gate field effect transistor according to claim 6 wherein the concave surface portion is equally curved both in the transverse cross-sectional plane and in the non-transverse cross-sectional plane, so as to provide a sheet-like depletion region having a uniform thickness and a smooth bottom boundary underlying the channel region and the source and drain regions, when the transistor is in a turned-off state.

8. An insulated-gate field effect transistor according to claim 4 wherein the concave surface portion is continuously curved from the point where it descends below and away from the main surface of the substrate to the point where it ascends to re-join the main surface of the substrate.

9. An insulated-gate field effect transistor according to claim 4 wherein the gate fills the void created by the concave surface portion and insulating layer at least from the level where the concave surface portion and insulating layer descend below the level of the main surface of the substrate.

10. An insulated-gate field effect transistor according to claim 4 wherein the concave surface portion is defined by isotropic plasma etching.

11. An insulated-gate field effect transistor according to claim 4 wherein the depth of the concave surface portion is set to a value which ranges between one and two times the depth of the source and drain regions.

12. An insulated-gate field effect transistor according to claim 4 wherein the depth of the drain region is 0.5 to 0.6 microns and the depth of the concave surface portion is set to approximately one micron.

13. An insulated-gate field effect transistor according to claim 4 wherein the concave surface portion is defined by focal ion beam etching.

14. An insulated-gate field effect transistor comprising:
- a substrate having a substantially planar main surface and a concave surface portion extending continuously from the main surface to a predetermined depth below the main surface;
- an insulating layer conformably disposed on the main surface and the concave surface portion;
- a gate conformably disposed on the insulating layer, overlying the concave surface portion, the gate having opposed first and second sides;
- implanted source and drain regions disposed within the substrate respectively at the first and second opposed sides of the gate, the drain region having a bottom surface which curves upwardly toward the top surface of the substrate; and
- a channel-region formed between the source and drain regions, for defining a channel that conducts current between the source and drain regions when the transistor is in a turned-on state;
- wherein a channel-free zone develops in the substrate, under the gate and between the source region and the upwardly curved bottom surface of the drain region, when the transistor is in a turned-off state; and
- wherein the gate and concave surface portion are curved at least in the vicinity of the channel-free zone, and the upwardly curved bottom surface of the drain region is also curved, such that a smoothly curved depletion zone boundary will develop in the vicinity of the channel-free zone when the transistor is in the turned-off state.

* * * * *

UNITED STATES PATENT AND TRADEMARK OFFICE
CERTIFICATE OF CORRECTION

PATENT NO. : 5,248,893

DATED : September 28, 1993

INVENTOR(S) : Shinichi Sakamoto

It is certified that error appears in the above-identified patent and that said Letters Patent is hereby corrected as shown below:

Claim 1,
Column 5, Line 29,     "surfaces" should be --surface--.

Signed and Sealed this

Twentieth Day of September, 1994

Attest:

BRUCE LEHMAN

Attesting Officer                Commissioner of Patents and Trademarks